US010067246B2

(12) United States Patent
Hospodková et al.

(10) Patent No.: US 10,067,246 B2
(45) Date of Patent: Sep. 4, 2018

(54) SCINTILLATION DETECTOR FOR DETECTION OF IONISING RADIATION

(71) Applicants: CRYTUR, SPOL. S R.O., Turnov (CZ); FYZIKÁLNÍÚSTAV AV ĈR, V.V.I., Prague (CZ)

(72) Inventors: Alice Hospodková, Prague (CZ); Karel Blažek, Turnov (CZ); Eduard Hulicius, Prague (CZ); Jan Touŝ, Turnov (CZ); Martin Nikl, Prague (CZ)

(73) Assignees: CRYTUR, SPOL. S R.O., Turnov (CZ); FYZIKÁLNÍÚSTAV AV CR, V.V.I., Prague (CZ)

( * ) Notice: Subject to any disclaimer, the term of this patent is extended or adjusted under 35 U.S.C. 154(b) by 0 days.

(21) Appl. No.: 15/541,476

(22) PCT Filed: Feb. 8, 2016

(86) PCT No.: PCT/CZ2016/000012

§ 371 (c)(1),
(2) Date: Jul. 4, 2017

(87) PCT Pub. No.: WO2016/127959

PCT Pub. Date: Aug. 18, 2016

(65) Prior Publication Data

US 2018/0059268 A1 Mar. 1, 2018

(30) Foreign Application Priority Data

Feb. 9, 2015 (CZ) ................................ PV 2015-82

(51) Int. Cl.
*G01T 1/29* (2006.01)
*G01T 1/164* (2006.01)
(Continued)

(52) U.S. Cl.
CPC .......... *G01T 1/2985* (2013.01); *G01T 1/1644* (2013.01); *G01T 1/2023* (2013.01);
(Continued)

(58) Field of Classification Search
CPC ....... G01T 1/1644; G01T 1/2023; G01T 1/24; G01T 1/2985; H01J 37/244; H01J 49/025; H01J 2237/2443
See application file for complete search history.

(56) References Cited

U.S. PATENT DOCUMENTS

2014/0138617 A1* 5/2014 Lai .......................... H01L 33/06 257/13

* cited by examiner

*Primary Examiner* — Mark R Gaworecki
(74) *Attorney, Agent, or Firm* — Mark M. Friedman

(57) ABSTRACT

A scintillation detector for detecting ionizing radiation, which comprises: a monocrystalline substrate layer; at least one bottom nitride semiconductor layer; an active area on top of the nitride bottom semiconductor layer, which comprises a plurality of alternating nitride semiconductor layers of substantially the same polarization, each couple of the alternating layers consists of a barrier layer of a $Al_{yb}In_{xb}Ga_{1-xb-yb}N$ type and a potential well layer of a $Al_{yw}In_{xw}Ga_{1-xw-yw}N$ type for radiant recombinations of electrons and holes, where xb≤xw and yb≤yw is valid; at least one top nitride semiconductor layer on top of the active area; and at least one GaN buffer layer for binding with epitaxy on top of said monocrystalline substrate a structure which comprises: the bottom nitride semiconductor layer; the alternating layers of the active area; and the top nitride semiconductor layer; each of the nitride semiconductor layers has the general formula of $Al_yIn_xGa_{1-x-y}N$.

11 Claims, 8 Drawing Sheets

Figure 1:
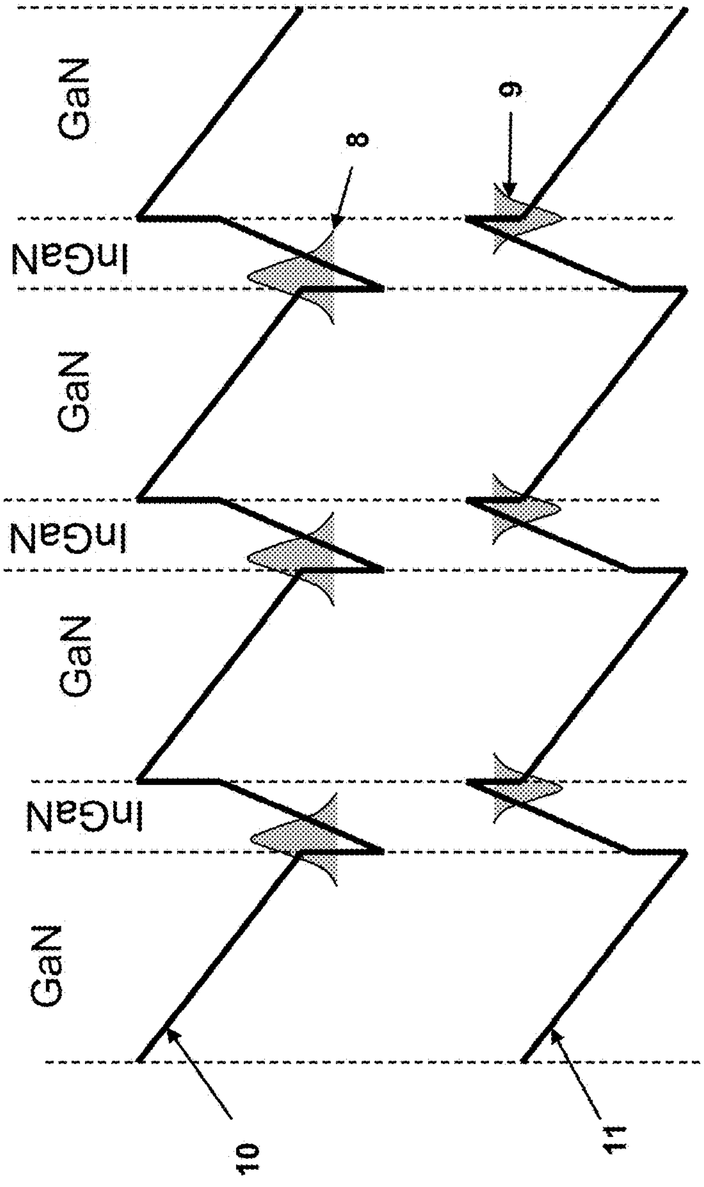

(51) Int. Cl.
*G01T 1/24* (2006.01)
*H01J 37/244* (2006.01)
*H01J 49/02* (2006.01)
*G01T 1/202* (2006.01)

(52) U.S. Cl.
CPC .............. *G01T 1/24* (2013.01); *H01J 37/244* (2013.01); *H01J 49/025* (2013.01); *H01J 2237/2443* (2013.01)

SCINTILLATION DETECTOR FOR DETECTION OF IONISING RADIATION

FIELD OF THE INVENTION

The invention refers to semiconductor monocrystalline scintillation detectors with nitride heterostructure, designated for the detection of ionising radiation, especially electron, X-ray or particle radiation.

BACKGROUND OF THE INVENTION

It is known that semiconductors with a broad band gap, such as GaN or ZnO, are suitable for utilization in detectors of ionising radiation. The materials of this type show a short decay time of excited luminescence in the order of 1 ns and are radiation resistant. The advantage of GaN is the possibility of its preparation in higher crystallographic quality and in the form of homogenous epitaxial layers, applied onto large surfaces of monocrystalline substrates in up to several different layers on top of each other which results in the creation of heterostructures. These heterostructures show low non-radiant losses and a narrow luminescence maximum.

The patent document U.S. Pat. No. 7,053,375 B2 describes a semiconductor scintillator, including group III elements from the periodic table in compound with nitrogen in the form of a semiconductor for the excitation with ionising radiation. This semiconductor compound is structured into a layer, formed on a generally described substrate. Furthermore, there might be between the semiconductor layer and the substrate a semi-layer to smoothen/improve the semiconductor structure that is called a buffer layer. Various nitride compounds with a group III element and their alloys may be utilized in different layers applied over each other and create heterostructures.

Another known patent document U.S. Pat. No. 8,164,069 B2 describes a fluorescent agent reaction to the electron incidence with light emission, luminescence. The fluorescent agent includes a carrier monocrystalline substrate, nitride semiconductor sandwich structure, in which barrier layers alternate with layers representing potential wells. The semiconductor layers create a heterostructure which is formed on the surface of one substrate side. The potential wells are preferentially created with an $In_xGa_{1-x}N$ alloy semiconductor.

A disadvantage of above mentioned solutions is that they do not consider the strong piezoelectric field, which is formed between interfaces of layers with different composition. This piezoelectric field decreases the electron-hole wave function overlap and consequently considerably decreases the luminescence intensity and prolongs the luminescence decay time. This means that the scintillator will have less intensive and slower response. The next disadvantage of the above stated solutions consist of the fact that during the incidence of the ionising radiation a relatively large amount of energy is consumed for a non-radiative electron-hole recombination in the semiconductor material. The presence of potential wells improves this rate, however, the resulting ratio of the consumed energy for the radiative and non-radiative recombination still does not suffice. The attainment of a higher number of potential wells in the semiconductor layer that would improve the resulting ratio of recombination energies is prevented by the increased strain in the structure due to the increasing number of the $In_xGa_{1-x}N$ wells, caused by the different lattice constant of $In_xGa_{1-x}N$.

The task of the invention is to create a monocrystalline nitride scintillation detector for the detection of ionising radiation that would eliminate the drawbacks of the known solutions, suppress the influence of piezoelectric field and decreased the strain in the structure, which would increase the intensity and speed of luminescent response to the incident ionising radiation.

SUMMARY OF THE INVENTION

The set task is solved by creating a scintillation detector for the detection of ionising radiation, especially electron, X-ray or particle radiation.

The scintillation detector includes a monocrystalline substrate onto which minimally one buffer layer is applied. The buffer layer is applied for a stable binding of minimally one nitride semiconductor layer to the monocrystalline substrate with epitaxy. The nitride semiconductor layer is described with the $Al_yIn_xGa_{1-x-y}N$ general formula for which the $0 \le x \le 1$, $0 \le y \le 1$ and $0 \le x+y \le 1$ relations apply. Simultaneously, minimally two nitride semiconductor layers are arranged into a layered heterostructure, whose structure contains minimally one potential well for radiative recombinations of electrons and holes generated by incident radiation.

The principle of the invention comprises the fact that the buffer layer is created with minimally one bottom nitride semiconductor layer and above the bottom nitride semiconductor layer, there is arranged minimally one active couple of nitride semiconductor layers of principally the same polarisation. The active couple consists of a barrier layer of the $Al_{yb}In_{xb}Ga_{1-xb-yb}N$ type and from the layer of the $Al_{yw}In_{xw}Ga_{1-xw-yw}N$ type representing the potential well where the $xb \le xw$ a $yb \le yw$ relations are valid for the active couple. Or in case that the active couple layers do not have the same polarisation there is inserted in minimally one active couple of nitride semiconductor layers minimally one layer of the $Al_{yd}In_{xd}Ga_{1-xd-yd}N$ type with the thickness less than 2 nm in which $yd \le yw$ and $xd \ge xw+0.3$ is valid to create an carrier attracting layer inside the layer adjoining to it, representing a potential well to decrease the luminescence decay time. Above the topmost active couple in the direction away from the substrate, there is arranged minimally one top nitride semiconductor layer.

The advantages of the scintillation detector with principally the same polarisation of active couple layers include a short decay time which is in units of nanoseconds and high luminescence intensity, caused by improved overlap of the hole and electron wave functions. Another manner of increasing the overlap of the electron and hole wave functions is the insertion of the carrier attracting layer that pulls inside itself electrons and holes which results in electron and hole spatial approximation, thus increasing the excited luminescence intensity and making faster the scintillator luminesce response.

In another preferred execution of the scintillation detector with GaN buffer layer according to this invention, the composition and thickness of the barrier layer and the layer representing the potential well conform to the relation $$|d_1 \cdot (4.3 \cdot xw - yw) + d_2 \cdot (4.3 \cdot xb - yb)| \le 1$$

for the mutual compensation of strain in the epitaxial structure, thicknesses d1 and d2 are entered in nanometers. The compensation of strain in the active area of the heterostructure enables to increase the size of this active area of the heterostructure, therefore the area is enlarged for the incidence of the detected radiation and the number of released electrons and holes for radiative recombination is increased which results in the improvement of the scintillation detector function.

In another preferred execution of the scintillation detector according to this invention, the active area of the heterostructure includes minimally two periodically repeated active couples of nitride semiconductor layers whose total thickness exceeds 200 nm.

In another preferred execution of the scintillation detector according to this invention, the bottom nitride semiconductor layer is of the $Al_yIn_xGa_{1-x-y}N$ type where $0 \leq x < 0.5$, $0 \leq y < 0.5$ and $0 \leq x+y \leq 1$ is valid.

In another preferred execution of the scintillation detector according to this invention, the heterostructure is doped with the atoms of the group IV elements into the depth of minimally 1 μm from the external surface of the top nitride semiconductor layer to attain sufficient conductibility of the structure and the possibility to lead away the surplus negative charge caused by the incident electron beam. The silicon atoms of the concentration up to $10^{19}$ $cm^{-3}$ are preferentially used.

In another preferred execution of the scintillation detector according to this invention, the monocrystalline substrate is from the materials from the yttrium-aluminium perovskite, monocrystalline GaN form or sapphire.

In another preferred execution of the scintillation detector according to this invention prepared on the monocrystalline yttrium-aluminium perovskite substrate, doped with rare earth elements to stabilise the growth process.

The advantages of the fast scintillator for the detection of ionising radiation, especially the electron, X-ray or particle radiation are the fast decay time, higher luminescence intensity, at least partial compensation of the piezoelectric field and strain in the active area, including the elimination of the piezoelectric field influence by utilizing the carrier attracting layer.

CLARIFICATION OF DRAWINGS

Figure 2:
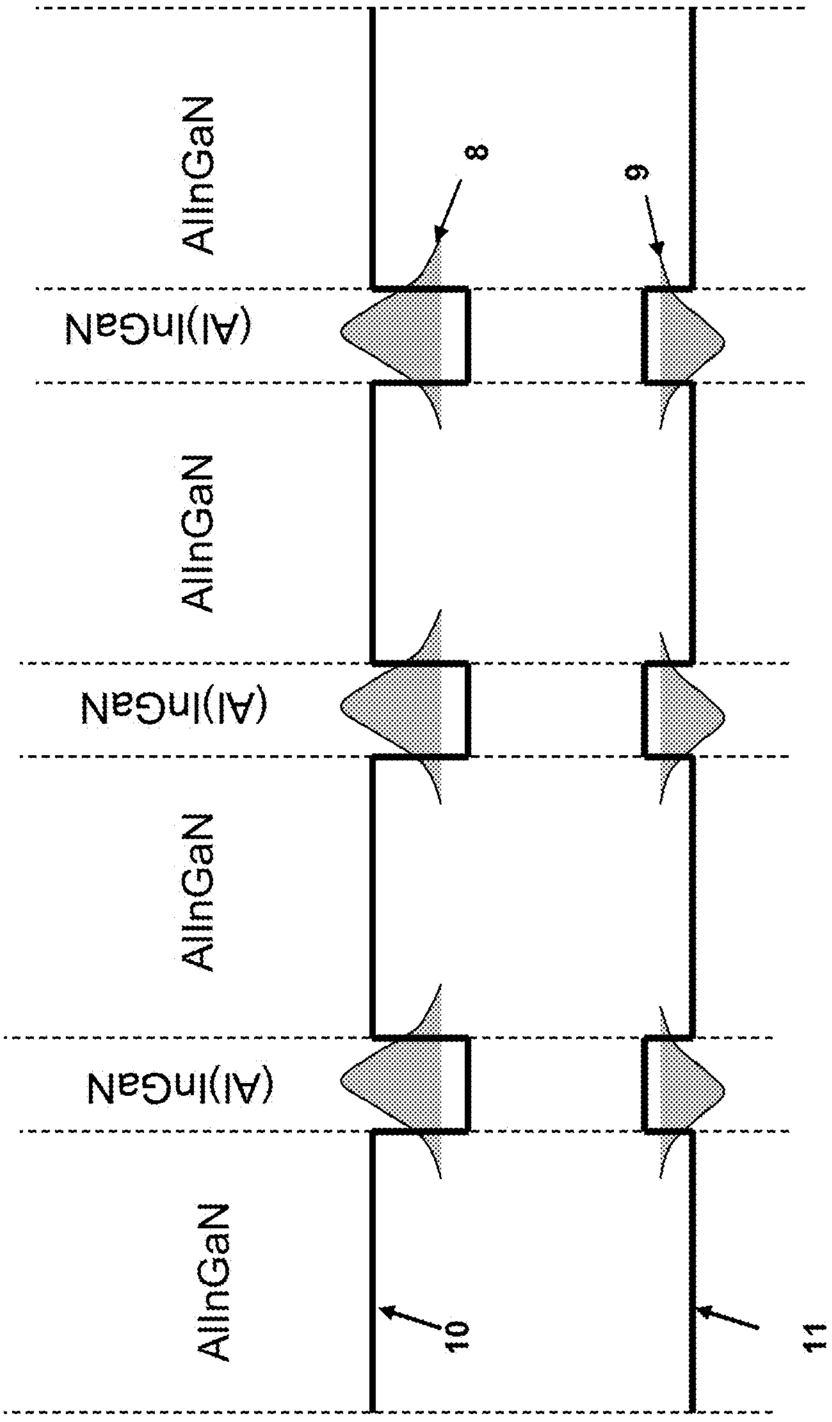
Figure 3:
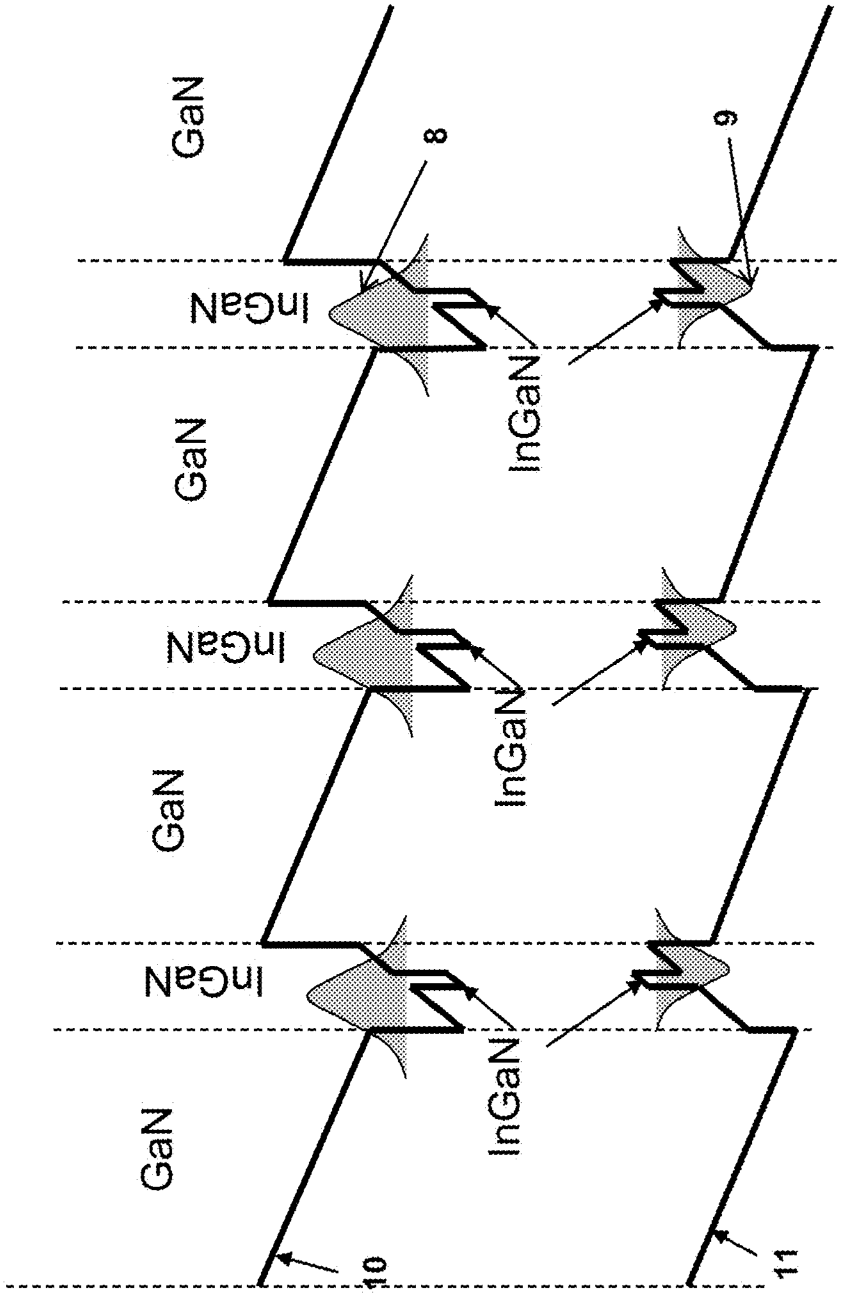
Figure 4:
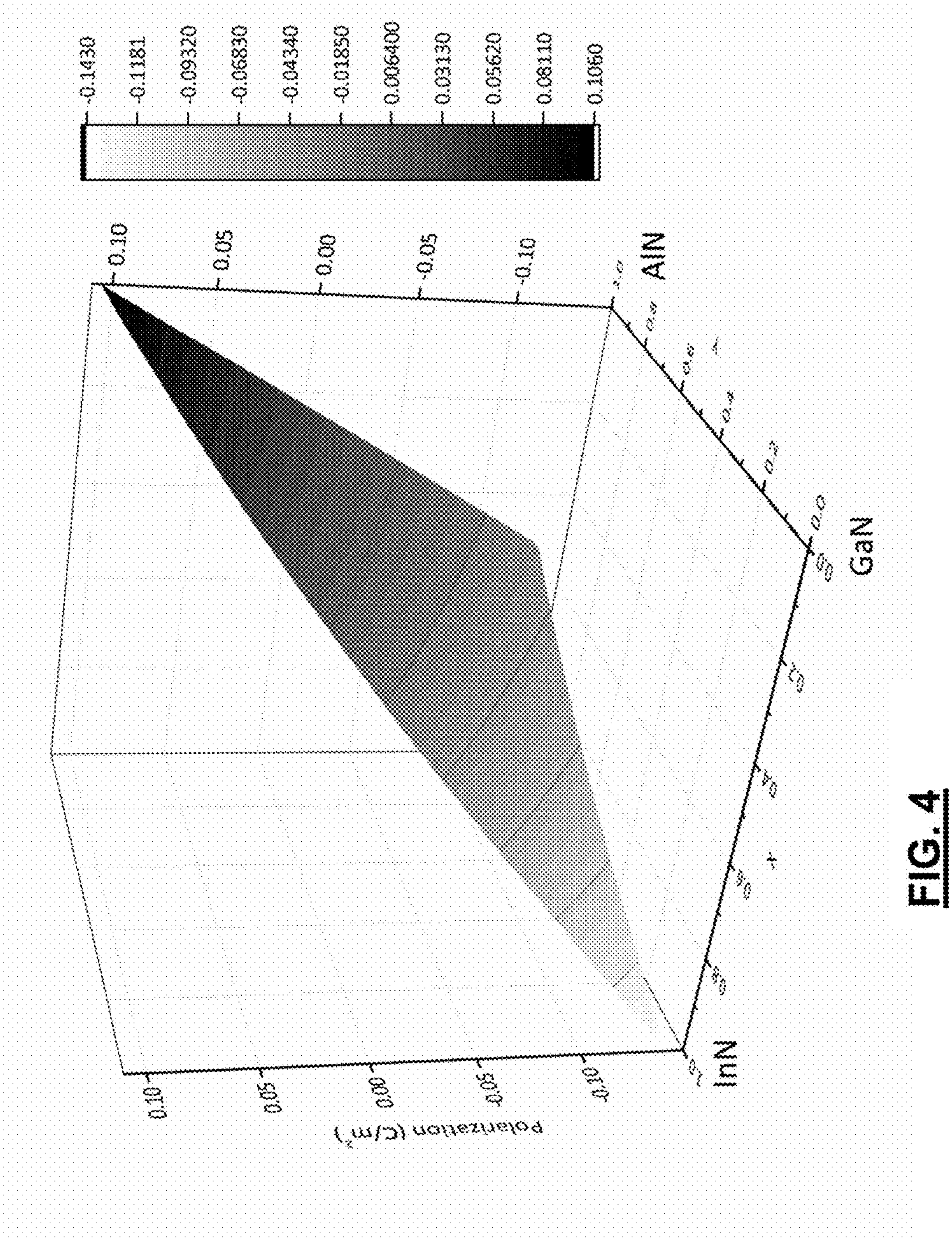
Figure 5:
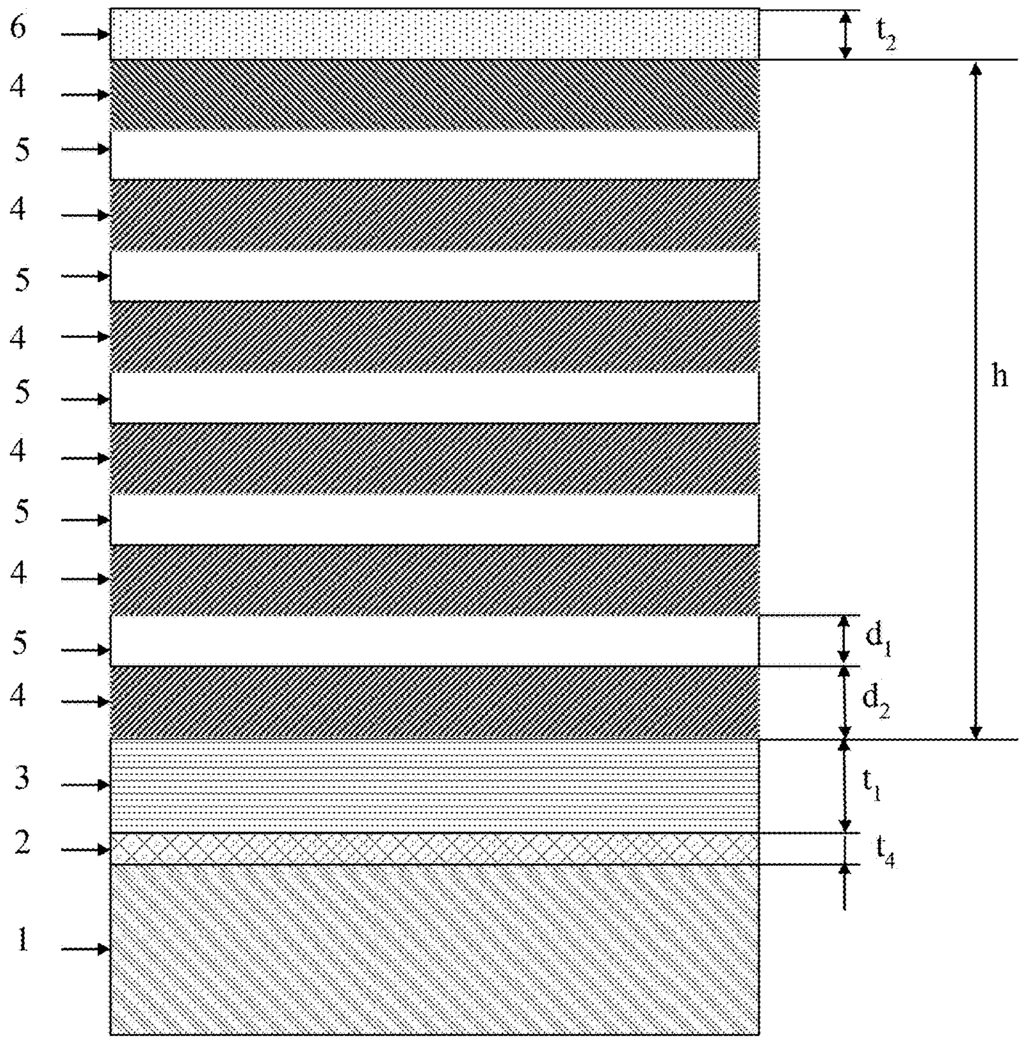
Figure 6:
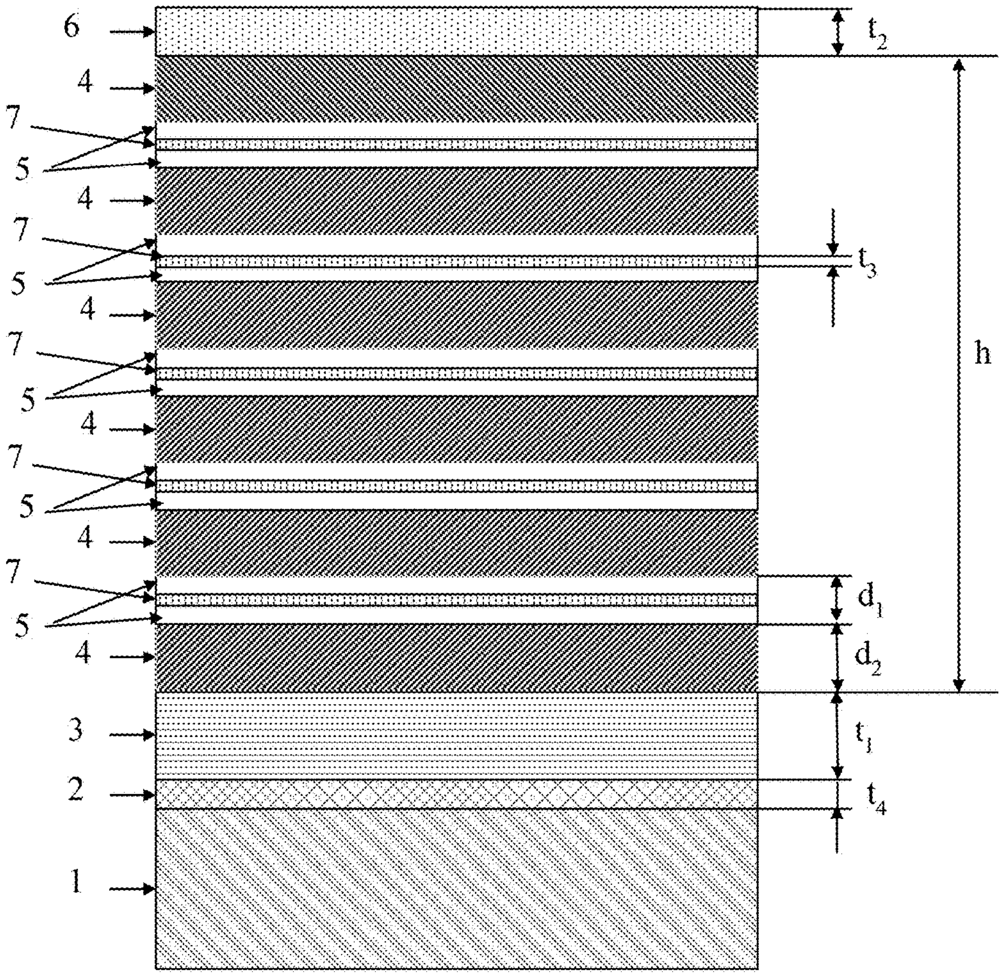
Figure 7:
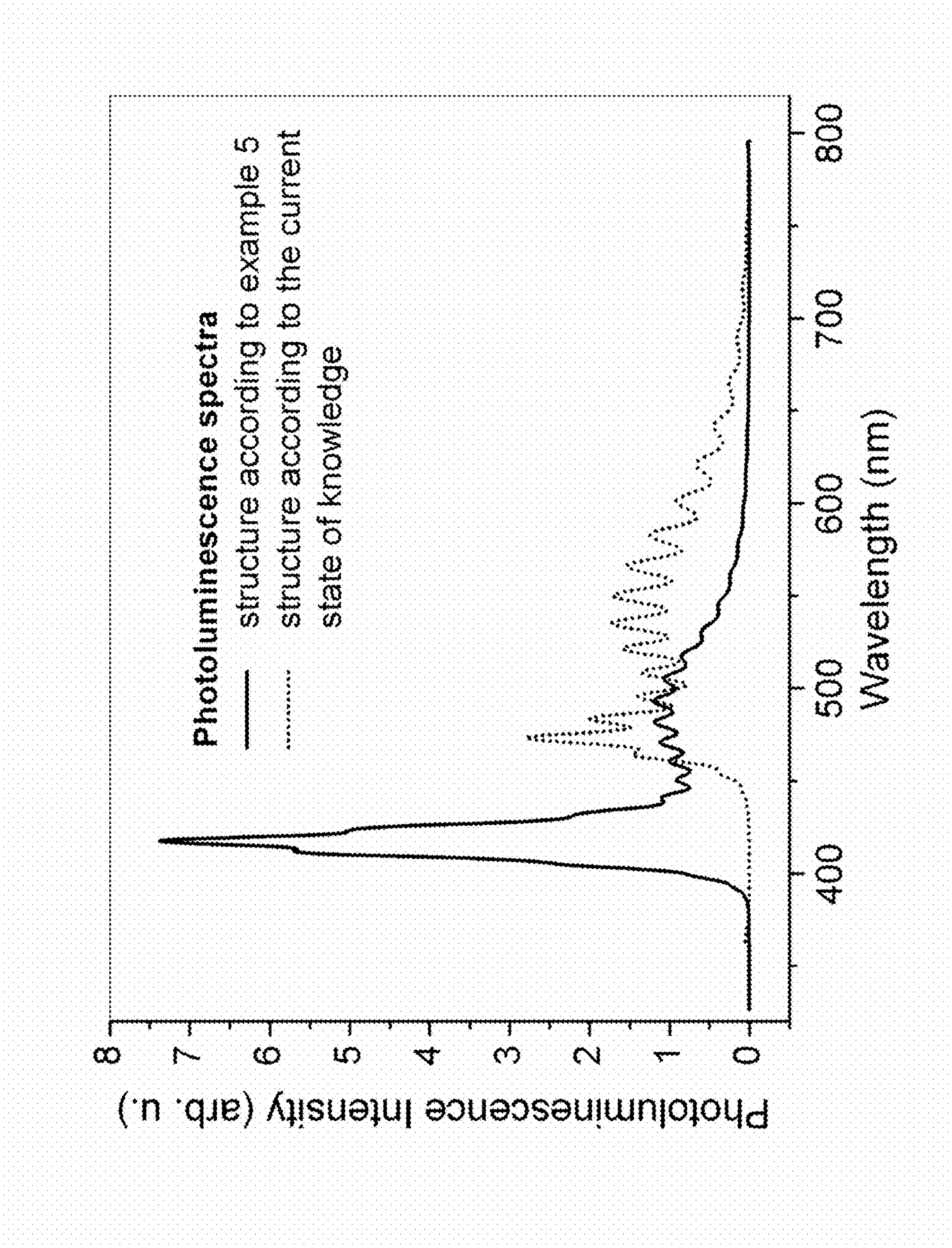
Figure 8:
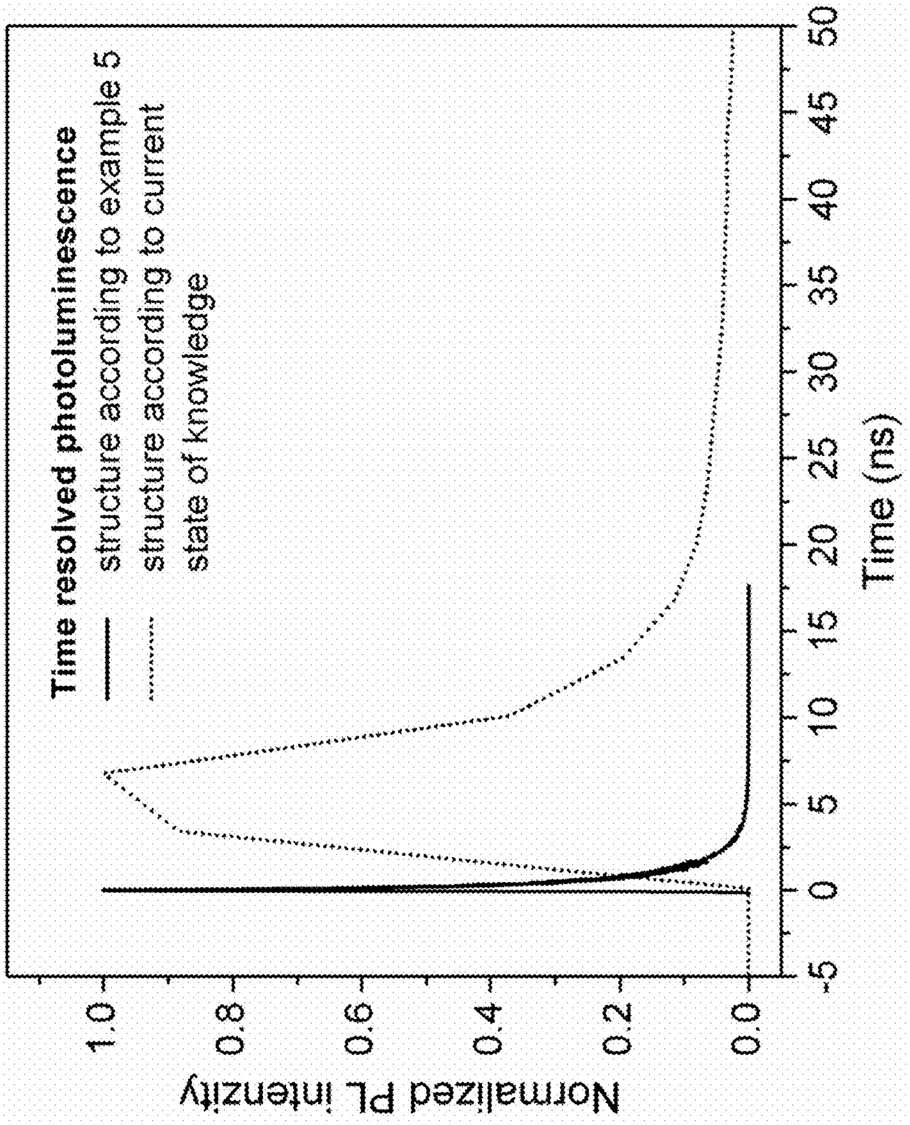

The stated invention shall be more closely clarified in enclosed drawings, where:

FIG. 1 illustrates a schematic depiction of the course of the conduction and valence bands edge of the scintillation nitride heterostructure with quantum wells without the compensation of the piezoelectric field and with a weak overlap of the electron and hole wave functions which deteriorates the scintillator luminescence intensity and extends its decay time, FIG. 2 illustrates schematically depicted course of the edge of the conduction and valence band of the scintillation nitride heterostructure with compensated piezoelectric field and more perfect overlap of wave functions, FIG. 3 illustrates schematically depicted course of the edge of the conduction and valence band of the scintillation nitride heterostructure with an immersed inversion potential barrier, FIG. 4 three-dimensional graph of ratios of individual components to preserve constant polarization, FIG. 5 schematic depiction of heterostructure layers with almost the same polarisation of individual layers of the active area created on the substrate, FIG. 6 schematic depiction of heterostructure layers with immersed carrier attracting layer, FIG. 7 comparison of spectral dependence of photoluminescence intensity of sample prepared according to suggested solution (Example 5) with sample prepared according to the current knowledge (U.S. Pat. No. 8,164,069 B2—thickness $In_xGa_{1-x}N$ quantum well 2.2 nm, x=0.13, thickness of GaN barrier 10 nm), FIG. 8 comparison of time resolved integrated photoluminescence intensity of sample prepared according to suggested solution (Example 5—decay time less than 1 ns) with sample prepared according to the current knowledge (U.S. Pat. No. 8,164,069 B2—thickness $In_xGa_{1-x}N$ quantum well 2.2 nm, x=0.13, thickness of GaN barrier 10 nm).

EXAMPLES OF THE PREFERRED EMBODIMENTS OF THE INVENTION

It is understood that the below stated and depicted specific examples of the invention execution are represented for illustration and not as the limitation of the invention to the stated examples. Experts knowledgeable of the state of technology will find or will be able to ensure, when performing routine experimentation, larger or smaller amount of equivalents to the specific executions of the invention which are described here. These equivalents shall be also included in the extent of the following patent claims.

FIG. 1 depicts conduction and valence band together with wave functions 8 and 9 of electrons and holes for scintillation detector designed according to the current knowledge. FIGS. 2 and 3 depict conduction and valence band together with wave functions 8 and 9 of electrons and holes for scintillation detector designed according to the here invented solutions, structure with balanced polarization in FIG. 2 and structure with immersed carrier attracting layer in FIG. 3. FIG. 4 depicts a 3-dimensional graph which illustrates the ratios of values of individual components of the active area material to preserve the balanced piezoelectric field. FIG. 5 schematically depicts a heterostructure created on the monocrystalline substrate 1 with balanced polarization. FIG. 6 schematically depicts a heterostructure created on the monocrystalline substrate 1 with immersed carrier attracting layer.

Example 1—Structure with Fully Compensated Piezoelectric Field

A part of the scintillator is a multilayer semiconductor nitride heterostructure with a GaN buffer layer 2 prepared with the MOVPE technology. It is essential for the quality and function of the heterostructure active area that the $Al_{yb}In_{xb}Ga_{1-xb-yb}N$ barrier layer 4 in the active area is lattice matched to the GaN buffer layer in the epitaxial plane and, simultaneously, that the $Al_{yw}In_{xw}Ga_{1-xw-yw}N$ layers 5 with a narrower band gap representing potential wells have the same polarisation as the barrier layers 4. The $Al_{yb}In_{xb}Ga_{1-xb-yb}N$ barrier layer 4 must contain approximately 4.3× more Al atoms than In atoms (yb=4.3·xb), so that it could be lattice matched to the buffer layer.

The heterostructure is prepared on the YAP (yttrium-aluminium perovskite) substrate 1 with orientation (111). After the preparation, the nitridation was performed of the substrate 1 in the $NH_3+N_2$ atmosphere at the temperature of 1050° C. for the period of 5 minutes. Furthermore, a GaN nucleation layer 2 was prepared at the temperature of 540° C. whose thickness $t_4$ is 30 nm. The GaN bottom layer 3 was doped with silicon atoms to the concentration of $1.10^{17}$ $cm^{-3}$ and was prepared at the temperature of 1050° C., the thickness $t_1$ of the bottom layer 3 is 2 μm. The active area of the heterostructure is created with alternating layers 4 and 5 with a broader and narrower band gap, prepared at the temperature of 830° C. The number of repetition of the active couples is 12. The parameters of the barrier layer 4 are $Al_{yb}In_{xb}Ga_{1-xb-yb}N_{yb}$, where xb=0.03, yb=0.17 and the thickness $d_2$ of the layer 4 is 16 nm. The layer 5 has parameters $Al_{yw}In_{xw}Ga_{1-xw-yw}N$, where xw=0.13, yw=0.24 and the thickness $d_1$ of the layer 5 is 5 nm. The active layer is doped with silicon to the concentration Si $2.10^{18}$ $cm^{-3}$. The covering layer 6 of the $Al_yGa_{1-y}N$ type was prepared at the temperature of 830° C. with the composition y=0.05.

Example 2—Structure with a Partially Balanced Piezoelectric Field and Fully Compensated Strain in Epitaxial Layers The multilayer semiconductor heterostructure was prepared according to Example 1 and the composition and thickness $d_2$ of the barrier layer 4 with a smaller lattice constant at, is arranged in such a manner that the strain caused by layer 5 representing a potential well with a larger lattice constant $a_w$ and thickness $d_1$ is balanced against the bottom layer 3 with lattice parameter $a_0$, which, in this Example, is created with GaN. Simultaneously, the piezoelectric field is compensated between the layers 4 and layers 5 representing a potential well (both the types have the same polarisation). The active area is created with alternating layers 4 and 5 with a broader and narrower band gaps, prepared at the temperature of 830° C. The number of repetition of the active couples is 30. The parameters of layers 4 and 5 are $Al_{yb}In_{xb}Ga_{1-xb-yb}N$, where $x_b$=0, $y_b$=0.15 with the thickness $d_2$ of the layer 13 nm and $Al_{yw}In_{xw}Ga_{1-xw-yw}N$, where $x_w$=0.13, $y_w$=0.24, with the thickness $d_1$ of the layer 6 nm.

Example 3—Structure with a Fully Compensated Piezoelectric Field and $In_xGa_{1-x}N$ Buffer Layer The multilayer semiconductor heterostructure was prepared according to Example 1 and the bottom layer 3 is created with an alloy semiconductor of the $In_xGa_{1-x}N$ type with the composition x=0.03 which enabled the decreasing of the Al content in the layers of the heterostructure active area. The active area is created with alternating layers 4 and 5 with a broader and narrower band gaps, prepared at the temperature of 830° C. The number of repetition of the active couples is 15. The parameters of layers 4 and 5 are $Al_{yb}In_{xb}Ga_{1-xb-yb}N$, where xb=0.02, yb=0.03, and the thickness $d_2$ of the layer 4 is 8 nm, and with layer 5 of the $Al_{yw}In_{xw}Ga_{1-xw-yw}N$ type, where xw 0.08, yw=0.09, the thickness $d_1$ is 2 nm.

Example 4—Structure with an Immersed Carrier Attracting Layer

This structure (ref to FIG. 3 and FIG. 6) is prepared according to Example 1, however, there is inserted in the layer 5 with a narrower band gap with the $Al_{yw}In_{xw}Ga_{1-xw-yw}N$ composition a thin $In_{xd}Ga_{1-xd}N$ layer 7 as the carrier attracting layer which pulls inside itself electrons and holes and thus improves the overlap of the wave functions of the charge carriers also in the case when piezoelectric field is present, therefore it enables to decrease the aluminium concentration in the active area.

The structure is prepared on the YAP (yttrium-aluminium perovskite) substrate 1 with orientation (111). The nitridation was performed of the substrate 1 in the $NH_3$+$N_2$ atmosphere at the temperature of 1050° C. for the period of 5 minutes. Subsequently, a nucleation layer 2 from the GaN material was prepared at the temperature of 540° C. whose thickness $t_4$ is 30 run. Then the bottom GaN layer 3 was created, doped with silicon atoms to the concentration of $1.10^{17}$ $cm^{-3}$ and prepared at the temperature of 1050° C., whose thickness $t_1$ is 2 μm.

The active area is created with alternating layers 4, 5 and 7 with a broader and narrower band gaps, prepared at the temperature of 830° C., 780° C. and 690° C. The number of repetition of the active triples is 15.

The parameters of the layer 4 are $Al_{yb}In_{xb}Ga_{1-xb-yb}N$, where xb=0.02, yb=0.09, and the thickness $d_2$ of the layer 4 is 12 nm. The parameters of the layer 5 are $Al_{yw}In_{xw}Ga_{1-xw-yw}N$, where xw=0.03, yw=0.07, and the thickness $d_1$ of the layer 5 is 2 nm. The parameters of the layer 7 are $In_{xd}Ga_{1-xd}N$, where xd=0.4, and the thickness $t_3$ of the layer 7 is 1 nm. The active area is also doped with silicon to the concentration Si $2.10^{18}$ $cm^{-3}$. An $Al_yGa_{1-y}N$ cover layer 6, prepared at the temperature 830° C. with the composition y=0.1, is also applied on the top of the heterostructure.

Example 5—Another Structure with an Immersed Carrier Attracting Layer

This structure (ref to FIG. 3 and FIG. 6) is prepared according to Example 4, however, the structure differs in composition and thickness of layers as well as the type of used substrate.

The structure is prepared on the sapphire substrate 1 with c- (0001) orientation. The nitridation was performed of the substrate 1 in the $NH_3$+$N_2$ atmosphere at the temperature of 1050° C. for the period of 5 minutes. Subsequently, a nucleation layer 2 from the GaN material was prepared at the temperature of 540° C. whose thickness $t_4$ is 25 nm. Then the bottom GaN layer 3 was created, doped with silicon atoms to the concentration of $1.10^{17}$ $cm^{-3}$ and prepared at the temperature of 1050° C., whose thickness $t_1$ is 6 μm.

The active area is created with alternating layers 4, 5 and 7 with a broader and narrower band gaps, prepared at the temperature of 830° C. 730° C. and 680° C. The number of repetition of the active triples is 15.

The parameters of the layer 4 are $Al_{yb}In_{xb}Ga_{1-xb-yb}N$, where xb=0, yb=0, and the thickness $d_2$ of the layer 4 is 10 nm. The parameters of the layer 5 are $Al_{yw}In_{xw}Ga_{1-xw-yw}N$, where xw=0.07, yw=0, and the thickness $d_1$ of the layer 5 is 2 nm. The parameters of the layer 2 are $In_{xd}Ga_{1-xd}N$, where xd=0.4, and the thickness $t_3$ of the layer 2 is 0.8 m. The active area is also doped with silicon to the concentration Si $1.10^{19}$ $cm^{-3}$. An $Al_yGa_{1-y}N$ cover layer 6, prepared at the temperature 830° C. with the composition y=0.1, is also applied on the top of the heterostructure.

Example 6—Structure with a Partially Balanced Piezoelectric Field and Fully Compensated Strain in Epitaxial Layers Prepared on YAP:Ce Substrate The multilayer semiconductor heterostructure was prepared according to Example 2 as the structure with fully compensated strain, but prepared on YAP substrate with orientation (111) and doped by Ce (0.17%). The structure also differs in thickness of active layers 4 and 5, where barrier layer 4 $Al_{yb}In_{Xb}Ga_{1-xb-yb}N$ with composition xb=0, yb=0.15 has thickness $d_2$=11 nm and of quantum well layer 5 has thickness $d_1$=5 nm and composition $x_W$=0.13, $y_W$=0.24. The number of layer doublet repetition is 30.

Example 7—Structure with a Partially Balanced Piezoelectric Field and Fully Compensated Strain in Epitaxial Layers Prepared on YAP:Nd Substrate The multilayer semiconductor heterostructure was prepared according to Example 6 as the structure with fully compensated strain, but prepared on YAP substrate with orientation (111) and doped by Nd (0.1%). The structure also differs in thickness of active layers 4 and 5, where barrier layer 4 $Al_{yB}In_{xb}Ga_{1-xb-yb}N$ with composition xb=0, yb=0.15 has thickness $d_2$=9 nm and quantum well layer 5 has thickness $d_1$=4 nm and composition $x_W$=0.13, $y_W$=0.24. The number of layer doublet repetition is 35.

INDUSTRIAL APPLICABILITY

The scintillation detector according to the invention for the detection of ionising radiation, especially electron, X-ray or particle radiation, can be utilized, among other things, especially in the medical area that works with ionising radiation, in electron microscopes, in devices requiring a fast detection designated for research or for analysis of materials and products, namely in applications to diagnose the quality of integrated circuits and other electronic parts, further on in microradiography, including fast high-definition CT systems, and in many other research areas, such as astronomy, particles physics etc.

OVERVIEW OF THE POSITIONS USED IN THE DRAWINGS

1 monocrystalline substrate
2 buffer layer
3 bottom nitride layer
4 barrier layer
5 layer representing a potential well
6 top nitride layer
7 layer representing an carrier attracting layer
8 wave function of electrons
9 wave function of holes
10 edge of conduction band
11 edge of valence band
$d_1$ thickness of layer representing a potential well
$d_2$ thickness of barrier layer
$t_1$ thickness of bottom nitride layer
$t_2$ thickness of top nitride layer
$t_3$ thickness of layer representing an carrier attracting layer
$t_4$ thickness of nucleation layer
h thickness of heterostructure active part

The invention claimed is:

1. A scintillation detector for the detection of ionising radiation, which comprises:

a monocrystalline substrate layer;

at least one bottom nitride semiconductor layer;

an active area on top of said nitride bottom semiconductor layer, said active area comprises a plurality of alternating nitride semiconductor layers of substantially the same polarisation, each couple of said alternating layers consists of a barrier layer of a $Al_{yb}In_{xb}Ga_{1-xb-yb}N$ type and a potential well layer of a $Al_{yw}In_{xw}Ga_{1-xw-yw}N$ type for radiant recombinations of electrons and holes, where xb≤xw and yb≤yw is valid;

at least one top nitride semiconductor layer on top of said active area; and at least one GaN buffer layer for binding with epitaxy on top of said monocrystalline substrate a structure which comprises: (i) said bottom nitride semiconductor layer; (ii) said alternating layers of the active area; and (iii) said top nitride semiconductor layer;

wherein each of said nitride semiconductor layers has the general formula of $Al_yIn_xGa_{1-x-y}N$.

2. A scintillation detector according to claim 1, wherein said ionising radiation is selected from an electron radiation, X-ray, or other particles radiation.

3. A scintillation detector according to claim 1, wherein at least one carrier attracting layer is inserted to within said potential well layer, said carrier attracting layer is of a $Al_{yd}In_{xd}Ga_{1-xd-yd}N$ type having a thickness ($t_3$) less than 2 nm, and in which yd≤yw and xd≥xw+0.3 is valid, said at least one carrier attracting layer decreases the luminescence decay time.

4. A scintillation detector according to claim 1, wherein the thicknesses ($d_1$, $d_2$) of the barrier layer and of the potential well layer, respectively, as well as their composition are configured to comply with a relation $|d_1\cdot(4.3\cdot xw-yw)+d_2\cdot(4.3\cdot xb-yb)|\leq 1$, to thereby provide a mutual compensation of a tension in an epitaxial plane which is prepared on said GaN buffer layer, where the thicknesses (d1, d2) are in nanometers.

5. A scintillation detector according to claim 1, wherein said active area comprises at least two couples of nitride semiconductor layers whose total thickness (h) exceeds 200 nm.

6. A scintillation detector according to claim 1 wherein said bottom nitride semiconductor layer is of a $Al_yIn_xGa_{1-x-y}N$ type, where 0≤x<0.5 and 0≤y<0.5 is valid.

7. A scintillation detector according to claim 1 which is doped with atoms of group IV elements into a depth of at least 1 μm from an external surface of the top nitride semiconductor layer.

8. A scintillation detector according to claim 7, wherein said atoms are silicon atoms with concentration up to $10^{19}$ $cm^{-3}$.

9. A scintillation detector according to claim 1, wherein said monocrystalline substrate layer is manufactured from a material selected from the group of: yttrium-aluminium perovskite, GaN monocrystalline form, or sapphire.

10. A scintillation detector according to claim 9, wherein said monocrystalline substrate is made of yttrium-aluminium perovskite which is doped with rare earth, while said buffer layer is made of $Al_yIn_xGa_{1-x-y}N$ with thickness ($t_4$) less than 50 nm.

11. A scintillation detector according to claim 10, wherein the rare earth is represented by cerium.

* * * * *